(12) United States Patent
Takano et al.

(10) Patent No.: US 11,715,701 B2
(45) Date of Patent: Aug. 1, 2023

(54) SEMICONDUCTOR DEVICE AND METHOD OF INSPECTING THE SAME

(71) Applicant: Toshiba Memory Corporation, Tokyo (JP)

(72) Inventors: Yuusuke Takano, Yokkaichi Mie (JP); Yoshiaki Goto, Kiyosu Aichi (JP); Takeshi Watanabe, Yokkaichi Mie (JP); Takashi Imoto, Kamakura Kanagawa (JP)

(73) Assignee: Kioxia Corporation, Tokyo (JP)

(*) Notice: Subject to any disclaimer, the term of this patent is extended or adjusted under 35 U.S.C. 154(b) by 308 days.

(21) Appl. No.: 16/386,774

(22) Filed: Apr. 17, 2019

(65) Prior Publication Data

US 2019/0244912 A1   Aug. 8, 2019

Related U.S. Application Data

(63) Continuation of application No. 14/474,635, filed on Sep. 2, 2014, now abandoned.

(30) Foreign Application Priority Data

Sep. 10, 2013   (JP) ................................. 2013-187132

(51) Int. Cl.
*H01L 23/552*   (2006.01)
*H01L 21/66*   (2006.01)
(Continued)

(52) U.S. Cl.
CPC ............ *H01L 23/552* (2013.01); *H01L 22/14* (2013.01); *H01L 24/48* (2013.01); *H01L 24/49* (2013.01);
(Continued)

(58) Field of Classification Search
None
See application file for complete search history.

(56) References Cited

U.S. PATENT DOCUMENTS 5,483,101 A   1/1996   Shimoto et al.
6,552,425 B1*   4/2003   Yan ........................ H01L 21/563
257/690
(Continued)

FOREIGN PATENT DOCUMENTS

CN   102623438 A   8/2012
JP   2009236712 A   10/2009
(Continued)

OTHER PUBLICATIONS

Japanese Office Action dated Dec. 22, 2015, filed in Japanese counterpart Patent Application No. 2015-0043137, 10 pages (with English translation).
(Continued)

*Primary Examiner* — Shaun M Campbell
(74) *Attorney, Agent, or Firm* — Kim & Stewart LLP

(57) ABSTRACT

According to one embodiment, a semiconductor device includes a wiring board that has a first surface and a second surface opposed to the first surface, a semiconductor chip provided on the first surface, external connection terminals provided on the second surface, a sealing resin layer provided on the first surface, and a conductive shield layer that covers at least a portion of a side surface of the wiring board and the sealing resin layer. The wiring board includes a first ground wire that is electrically connected to the conductive shield layer, and a second ground wire that is electrically connected to the conductive shield layer and is electrically insulated from the first ground wire.

17 Claims, 5 Drawing Sheets

(51) Int. Cl.
*H01L 23/00* (2006.01)
*H01L 23/31* (2006.01)
*G01R 31/28* (2006.01)

(52) U.S. Cl.
CPC ...... *G01R 31/2853* (2013.01); *H01L 23/3128* (2013.01); *H01L 2224/48095* (2013.01); *H01L 2224/48227* (2013.01); *H01L 2224/48228* (2013.01); *H01L 2224/49* (2013.01); *H01L 2924/00014* (2013.01); *H01L 2924/15192* (2013.01); *H01L 2924/15311* (2013.01); *H01L 2924/15787* (2013.01); *H01L 2924/15788* (2013.01); *H01L 2924/181* (2013.01); *H01L 2924/19107* (2013.01)

(56) References Cited

U.S. PATENT DOCUMENTS

| | | | |
|---|---|---|---|
| 7,932,517 | B2 | 4/2011 | Negishi |
| 8,043,896 | B2 | 10/2011 | Lee et al. |
| 2012/0015687 | A1 | 1/2012 | Yamada et al. |
| 2012/0193770 | A1* | 8/2012 | Yamada ............... H01L 21/561 |
| | | | 257/659 |
| 2013/0257462 | A1* | 10/2013 | Ding .................... G01R 1/0433 |
| | | | 324/705 |
| 2013/0324069 | A1 | 12/2013 | Chen et al. |
| 2015/0129874 | A1* | 5/2015 | Choi ....................... H01L 22/32 |
| | | | 257/48 |

FOREIGN PATENT DOCUMENTS

| | | |
|---|---|---|
| JP | 2010109274 A | 5/2010 |
| JP | 2012146882 A | 8/2012 |
| JP | 2012160578 A | 8/2012 |
| JP | 5684349 B1 | 3/2015 |
| WO | 2010014103 A1 | 2/2010 |

OTHER PUBLICATIONS

Chinese Office Action dated Sep. 1, 2016, filed in Chinese counterpart Application No. 201307295625, 14 pages (with English translation).

Chinese Second Office Action dated Mar. 7, 2017, filed in Chinese counterpart Application No. 201310729562.5, 16 pages (with English translation).

Japanese Office Action with English translation, Patent Application No. JP 2015-004137, dated Jul. 14, 2015, 8 pages.

Office Action dated Sep. 16, 2014, filed in corresponding Japanese Patent Application No. 2013-187132, with English translation.

* cited by examiner

SEMICONDUCTOR DEVICE AND METHOD OF INSPECTING THE SAME

CROSS-REFERENCE TO RELATED APPLICATION

This application is a continuation of U.S. patent application Ser. No. 14/474,635, filed on Sep. 2, 2014, which is based upon and claims the benefit of priority from Japanese Patent Application No. 2013-187132, filed Sep. 10, 2013, the entire contents of each of which are incorporated herein by reference.

FIELD

Embodiments described herein relate generally to a semiconductor device and a method of inspecting the semiconductor device.

BACKGROUND

In a semiconductor device for a communication device or the like, in order to suppress electromagnetic interference (EMI), a surface thereof is covered with a conductive shield layer. To achieve sufficient magnetic shielding effect with the above described structure, the conductive shield layer is connected to a ground wire, thereby grounding the electromagnetic energy, that would otherwise cause EMI or "noise", to the exterior of a packaged device through the ground wire.

In this case, if the electric connection between the conductive shield layer and the ground wire is defective, this electro-magnetic shielding effect may not be achieved. For this reason, an inspection (a conductivity inspection) must be undertaken to determine whether the electrical connection between a conductive shield layer and a ground wire is sufficient, to select for further use only those semiconductor devices in which a sufficient electro-magnetic shielding effect is achieved. The above described conductivity inspection is performed by bringing terminals of a tester into contact with a conductive shield layer and an external connection terminal electrically connected to a ground wire, and measuring the resistance value between the external connection terminal and the conductive shield layer. This inspecting method needs to use a dedicated measuring device, and thus is inconvenient, and the contact probe of the tester can damage a portion of the surface of a conductive shield layer. Therefore, an inspecting method which is simpler and suppresses damage to the packaged device, including the shield layer, is required.

DETAILED DESCRIPTION

An embodiment is provided by which it is possible to simply perform a conductivity inspection on a semiconductor device to determine the presence and effectiveness of the connection of the shield layer thereof to a ground terminal, and a method of inspecting the semiconductor device.

In general, according to one embodiment, a semiconductor device includes: a wiring board that has a first surface and a second surface, a semiconductor chip that is provided on the first surface of the wiring board, a sealing resin layer that is provided on the first surface, and a conductive shield layer that covers at least a portion of a side surface of the wiring board and the sealing resin layer. The wiring board also includes a first ground wire that is electrically connected to the conductive shield layer, and a second ground wire that is electrically connected to the conductive shield layer and is electrically insulated from the first ground wire, and external connection terminals including a first ground terminal that is electrically connected to the first ground wire, and a second ground terminal that is electrically connected to the second ground wire. Thus, by connecting a conductivity measuring device to, i.e., by measuring the resistance between, the first and second ground terminals, the effectiveness of the ground connection to the shield layer can be determined.

Figure 1:
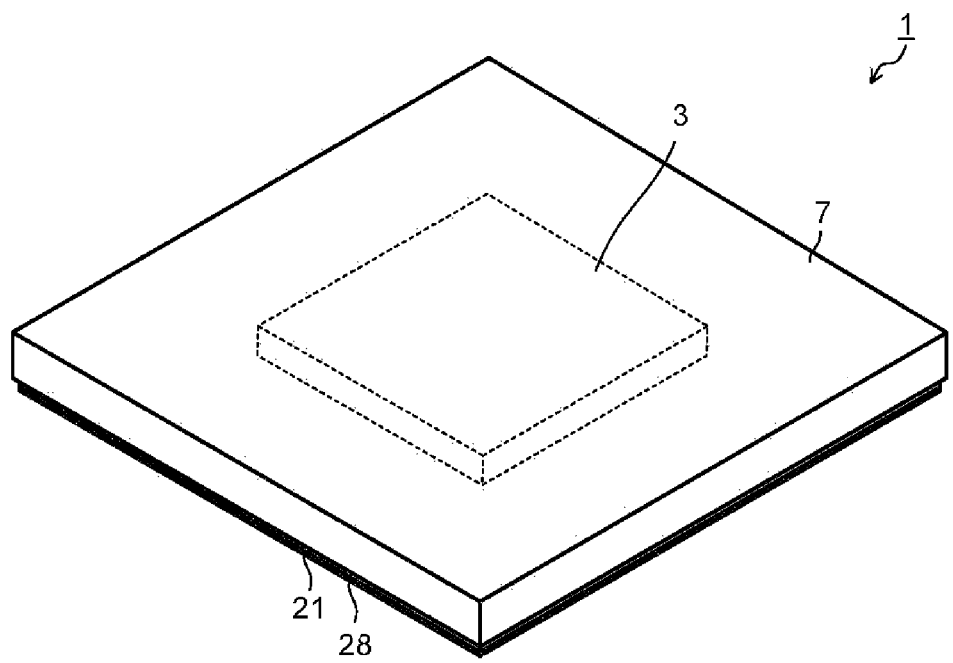
FIG. 1 is a perspective view illustrating a packaged semiconductor device.

Hereinafter, a semiconductor device according to an embodiment will be described with reference to the accompanying drawings. FIG. 1 is a perspective view illustrating a semiconductor device, and FIG. 2 is a cross-sectional view illustrating the semiconductor device illustrated in FIG. 1.

Figure 2:
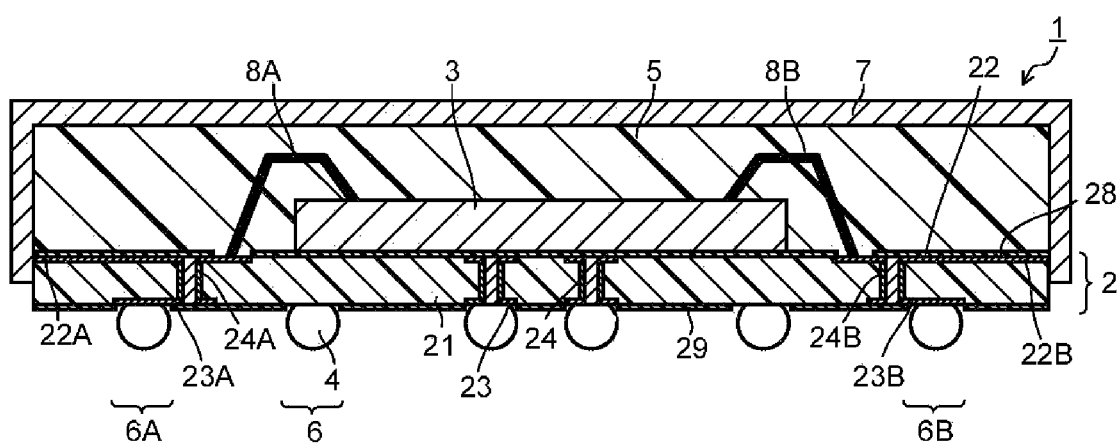
FIG. 2 is a cross-sectional view illustrating the packaged semiconductor device.

A semiconductor device 1 illustrated in FIGS. 1 and 2 includes: a wiring board 2 that has a first surface and a second surface; a semiconductor chip 3 that has electrode pads and is provided on the first surface of the wiring board 2; a sealing resin layer 5 that is provided on the first surface of the wiring board 2 and exposed surfaces of the semiconductor chip 3 thereabout so as to seal the semiconductor chip 3 from a surrounding environment; external connection terminals 6 that are provided on the second surface; a conductive shield layer 7 that extends over at least a portion of the side surface of the wiring board 2 as well as over the sealing resin layer 5; a bonding wire 8A; and a bonding wire 8B. Also, the first surface of the wiring board 2 corresponds to the upper surface (chip 3 receiving surface) of the wiring board 2 of FIG. 2, and the second surface corresponds to the lower surface of the wiring board 2 of FIG. 2, and the first surface and the second surface of the wiring board 2 face away from each other.

The wiring board 2 comprises an insulating layer 21 extending between the first surface and the second surface, a wiring layer 22 that is provided on the first surface, a wiring layer 23 that is provided on the second surface, vias 24 that are formed through the insulating layer 21, a solder resist layer 28 that is provided on the wiring layer 22, and a solder resist layer 29 that is provided on the wiring layer 23.

As the insulating layer 21, for example, a silicon substrate, a glass substrate, a ceramic substrate, and a substrate made of a resin such as epoxy may be used. Also, for the sealing resin layer 5, for example, an insulating organic resin material or the like may be used.

At the wiring layer 22 and the wiring layer 23, for example, signal wires, power supply wires, ground wires, and the like are provided. Each of the wiring layer 22 and the wiring layer 23 is not limited to a single layer structure, and may have a laminate structure obtained by stacking a plurality of conductive layers with insulating layers interposed therebetween. For the wiring layer 22 and the wiring layer 23, for example, copper foil, or conductive paste containing silver or copper is used, and in some cases, the surfaces of the wiring layer 22 and the wiring layer 23 may be plated with nickel, gold, or the like.

The wiring layer 22 includes a wire 22A and a wire 22B. The wire 22A has a function of acting as a first ground wire, and the wire 22B has a function of acting as a second ground wire. Also, during inspecting, the value of a potential which is supplied to the wire 22A may be different from the value of a potential which is supplied to the wire 22B. Also, the wire 22A and the wire 22B include connecting pads. The wiring layer 23 also includes a wire 23A and a wire 23B on the second surface of the wiring board 2, connected to the wires 22A and 22B respectively. The wire 23A and the wire 23B have connecting pads. Also, the wire 23A may have a function of acting as the first ground wire, and the wire 23B may have a function of acting as the second ground wire.

A plurality of vias 24 are formed through the insulating layer 21. The vias 24 include, for example, conductive layers provided on the inner surfaces of holes formed through the insulating layer 21, and hole filling members filling the insides of the conductive layers. For the conductive layers, for example, copper foil, or conductive paste containing silver or copper is used, and in some cases, the surfaces of the conductive layers may be plated with nickel, gold, or the like. The hole filling members are formed by using, for example, an insulating material or a conductive material. However, the present disclosure is not limited thereto. For example, the vias 24 may be formed by filling the through-holes with a metal material (such as copper) by plating.

Further, as the external connection terminals 6, for example, signal terminals, power supply terminals, ground terminals, and the like are provided. For example, the external connection terminals 6 include a ground terminal 6A and a ground terminal 6B. The ground terminal 6A is electrically connected to the wire 22A, and the ground terminal 6B is electrically connected to the wire 22B. In other words, the ground terminal 6A is electrically connected to the first ground wire, and the ground terminal 6B is electrically connected to the second ground wire 6B. The external connection terminals 6 include solder balls 4. The solder balls 4 are provided on the connecting pads of the wiring layer 23. Also, instead of the solder balls 4, lands may be provided.

The conductive shield layer 7 has the function of blocking electromagnetic energy waves reflected, or emanating, from the semiconductor chip 3 or the like, thereby preventing leakage thereof to the outside. As the conductive shield layer 7, for example, a metal layer having low electrical resistivity is preferably used, and for example, a metal layer containing copper, silver, nickel, or the like is preferably used. If a metal layer having low resistivity is used as the conductive shield layer 7, it is possible to suppress electromagnetic waves from leaking from the packaged semiconductor device 1.

The conductive shield layer 7 can, for example, be formed by applying conductive paste, for example, by a transfer method, a screen printing method, a spray coating method, a jet dispensing method, an inkjet method, an aerosol method, or the like over the sealing resin 5 and at least partially over the side wall of the wiring board 2. It is preferable that the conductive paste should contain, for example, a resin, and silver or copper, as main components, and have low resistivity. Also, a method of forming the conductive shield layer 7 of a film of copper, nickel, or the like by an electroless plating method or an electroplating method, or a method of forming a the conductive shield layer 7 of film of copper or the like by a sputtering method may be used.

It is preferable to choose the thickness of the conductive shield layer 7 based at least in part on the resistivity thereof. For example, it is preferable to set the thickness of the conductive shield layer 7 such that a sheet resistance value thereof obtained by dividing the resistivity of the conductive shield layer 7 by the thickness becomes 0.5Ω, or less. If the sheet resistance value of the conductive shield layer 7 is set to 0.5Ω or less, it is possible to reproducibly suppress leakage of electromagnetic waves from the sealing resin layer 5 and thus from the packaged semiconductor device 1. Also, in some cases, the conductive shield layer 7 may be overlaid with a protective layer superior in corrosion resistance and in migration resistance to the material of the conductive shield portion. For the protective layer, a polyimide resin or the like may be used.

The bonding wire 8A is electrically connected between the wire 22A on the first surface of the wiring board 2 and the semiconductor chip 3, and the bonding wire 8B is electrically connected between the wire 22B on the first surface of the wiring board 2 and the semiconductor chip 3. However, the present disclosure is not limited to this structure. It is only necessary to electrically connect a connecting pad of the wiring board 2 or the semiconductor chip 3 to the first ground wire or the second ground wire by at least the bonding wire 8A.

Further, in the semiconductor device according to the present embodiment, each of the first ground wire and the second ground wire are electrically connected to the conductive shield layer 7, and the first ground wire and the second ground wire are electrically insulated from each other.

Figure 3:
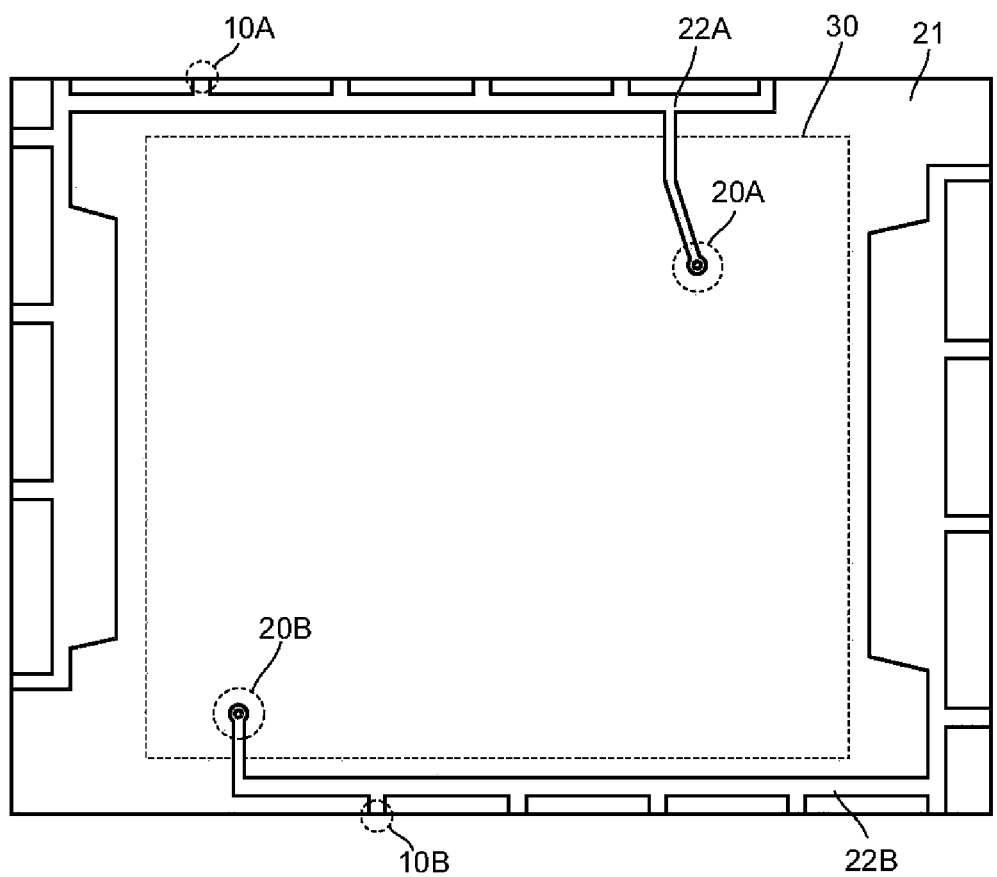
FIG. 3 is a top view schematically illustrating a wiring board.

FIG. 3 is a top view schematically illustrating an example of the wiring board 2. For the sake of convenience, in FIG. 3, the wire 22A and the wire 22B are illustrated, and the other components are not illustrated. A region 30 is a region within which the semiconductor chip 3 and a variety of wires are provided.

In FIG. 3, the wire 22A and the wire 22B are disposed along the edge of the wiring board 2 so as to be electrically insulated from each other. A contact portion 20A of the wire 22A is electrically connected to the ground terminal 6A through a via 24A, and a contact portion 20B of the wire 22B is electrically connected to the ground terminal 6B through a via 24B. Also, a plurality of contact portions 20A and/or a plurality of contact portions 20B may be provided.

Further, the side surface of the wire 22A and the side surface of the wire 22B are exposed along the side surface of the wiring board 2. As a result, the side surface of the wire 22A and the side surface of the wire 22B contact with the conductive shield layer 7. As described above, since the first ground wire and the second ground wire are electrically connected to the conductive shield layer 7, it is possible to pass electromagnetic energy to the outside of the packaged semiconductor device 1 through the first ground wire and the second ground wire. However, the present disclosure is not limited to this particular construct. For example the side surface of the wire 23A on the second surface of the wiring board and the side surface of the wire 23B on the second surface of the wiring board 2 may come into contact with the conductive shield layer 7.

Also, as is shown in FIG. 3, the wire 22A includes a plurality of extending portions 10A which are exposed along the side surface of the wiring board 2, and the wire 22B has a plurality of extending portions 10B which are exposed along the side surface of the wiring board 2 along the edge of the wiring board 2. By increasing the exposed area of the wire 22A and the exposed area of wire 22B at the side surface of the wiring board 2, it is possible to reduce the contact resistance between the wire 22A and the wire 22B and the conductive shield layer 7, and it is possible to improve the magnetic shielding effect.

In a semiconductor device including a conductive shield layer, in order to examine whether the conductive shield layer has a shielding effect, the conductivity between the conductive shield layer and a ground terminal may be inspected. According to a general inspecting method, a tester is brought into contact with the conductive shield layer and the ground terminal, and the resistance value between the conductive shield layer and the ground terminal is measured, whereby the conductivity between the conductive shield layer and the ground terminal is determined. In this case, it is necessary to use a dedicated device, and the inspection may damage the conductive shield layer.

In the semiconductor device according to the present embodiment, the ground wires are divided into two wiring systems (the first ground wire and the second ground wire), and the first ground wire is electrically connected to the ground terminal 6A, and the second ground wire is electrically connected to the ground terminal 6B, and the first ground wire and the second ground wire are electrically connected to the conductive shield layer 7. Therefore, for example, by bringing a tester into contact with the ground terminal 6A and the ground terminal 6B, it is possible to measure the resistance value between the ground terminal 6A and the ground terminal 6B, and to inspect the connection state of the first ground wire and the second ground wire with the conductive shield layer 7 based on the measured result. Therefore, it is possible to perform inspection without using a dedicated device. Also, since the tester is not brought into contact with the conductive shield layer 7, it is possible to suppress damage of the conductive shield layer 7 resulting from the inspection.

Also, in the present embodiment, an example in which the ground wires are divided into two wiring systems has been described. However, the present disclosure is not limited thereto. Ground wires may be divided into three or more systems (for example, four systems). The semiconductor device according to the present embodiment is appropriate to be applied to portable information communication terminals such as smart phones, tablet-type information communication terminals.

Also, in the semiconductor device according to the present embodiment, since the first ground wire or the second ground wire are disposed along the edge of the wiring board 2, the first ground wire and the second ground wire may act as conductive shield layers, thereby suppressing leakage of electromagnetic energy from the semiconductor chip 3 or the wiring board 2.

Figure 9:
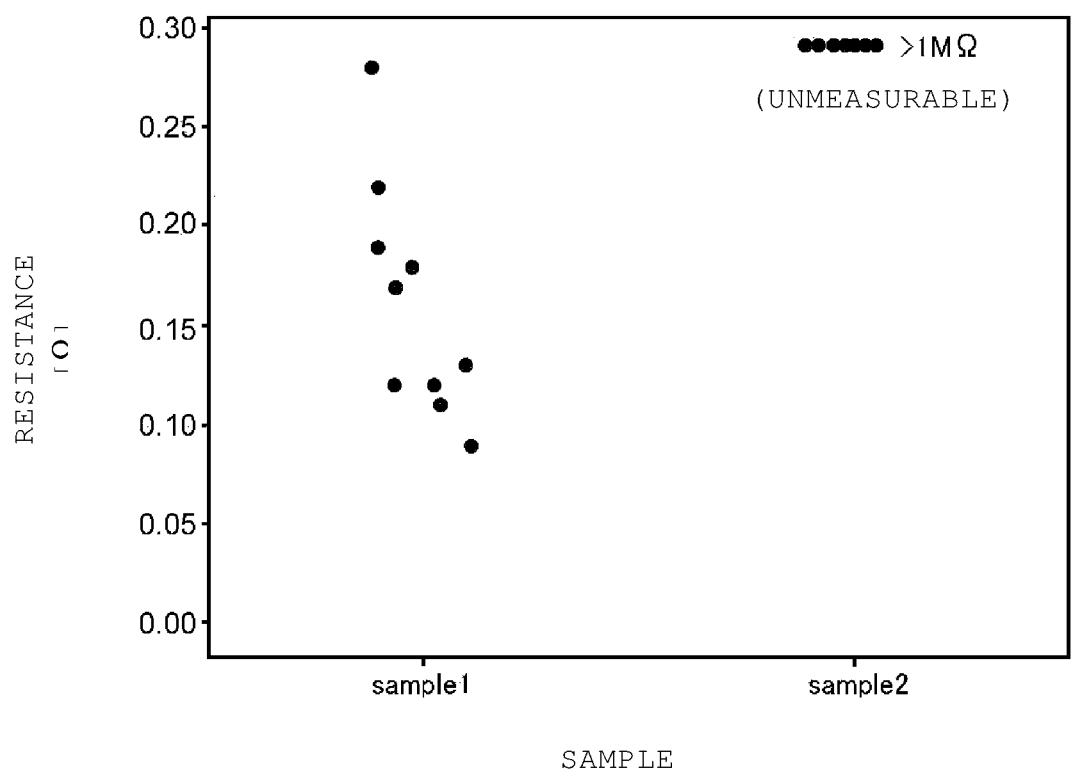
FIG. 9 is a view illustrating resistance value measurement results.

FIG. 9 illustrates measured results obtained by bringing a tester into contact with a ground terminal 6A and a ground terminal 6B in each of a plurality of semiconductor device samples, and measuring the resistance value between the ground terminal 6A and the ground terminal 6B. As illustrated in FIG. 9, the measured semiconductor device samples are divided into samples from which resistance values could be measured (here, samples representing resistance values of 0.1Ω to 0.3Ω) (a category "sample1"), and samples which are in open states and from which resistance values could not be measured (a category "sample2").

Further, the magnetic shielding effects of the samples belonging to the category "sample1" and the samples belonging to the category "sample2" are illustrated in Table 1. Also, magnetic field strengths are represented by measured values obtained with a measuring device positioned 1 mm above the center portions of the semiconductor devices and scanned thereacross with measurements taken at 1 mm increments. Also, the magnetic shielding effects are represented by values obtained from differences between cases where there is a conductive shield layer and cases where there is no conductive shield layer.

TABLE 1

|  | sample1 | sample2 |
| --- | --- | --- |
| MAGNETIC SHIELDING EFFECT (dB) | 19.9 | 7.6 |

From Table 1, it may be seen that the magnetic shielding effect of each sample belonging to the category "sample1" is 19.9 dB; whereas the magnetic shielding effect of each sample belonging to the category "sample2" is 7.6 dB which is extremely small, and the values of the magnetic shielding effects of the samples belonging to the category "sample1" are obviously different from the values of the magnetic shielding effects of the sample belonging to the category "sample2". From this, it may be seen that it is possible to select semiconductor devices lacking an effective ground connection, based on an insufficient magnetic shielding effect determined by the measured resistance values.

Figure 4:
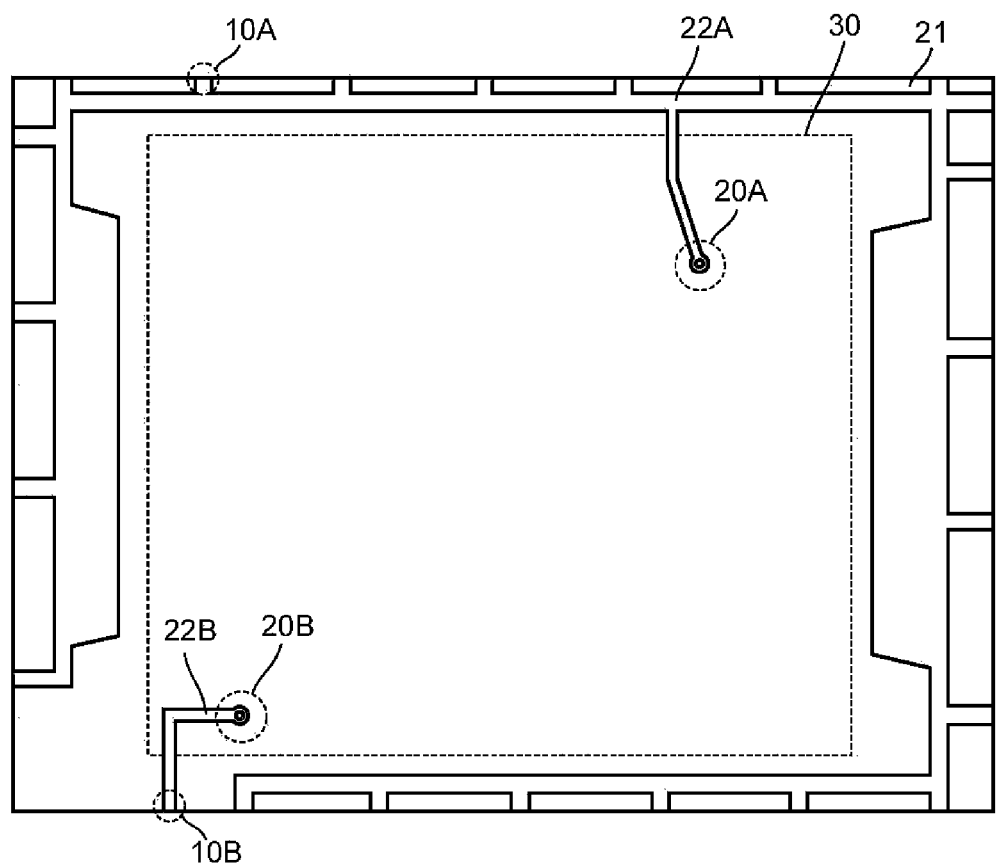
FIG. 4 is a top view schematically illustrating another wiring board.

Further, in the semiconductor device according to the present embodiment, by devising the upper surface layout of the wire 22A and the wire 22B, it is possible to further improve the magnetic shielding effect. For example, the wire 22A and the wire 22B may be extended in regions other than along the edge of the wiring board, for example, regions where other wires are not provided. In this case, the shapes of the wire 22A and the wire 22B may be mesh shapes. As the wire 22A and the wire 22B are extended, it is possible to suppress leakage of electromagnetic energy in the thickness direction of the semiconductor device 1. Also, as illustrated in FIG. 4, the wire 22B is connected to a single discrete wire 22B extending to a side of the wiring board, and may be used as a wire for conductivity inspection. In this case, during conductivity inspection, it is possible to suppress the influence on other elements connected to the ground wire on a measured result.

Further, the structure of the semiconductor device according to the present embodiment is not limited to the above described structure. Other structure examples of the semiconductor device will be described with reference to FIGS. 5 to 8. FIGS. 5 to 8 are cross-sectional views illustrating other examples of the semiconductor device. Also, with respect to components of semiconductor devices illustrated in FIGS. 5 to 8 and identical to those of the semiconductor device illustrated in FIG. 2, the same reference symbols are given, and the description of the semiconductor device illustrated in FIG. 2 will be appropriately cited.

Figure 5:
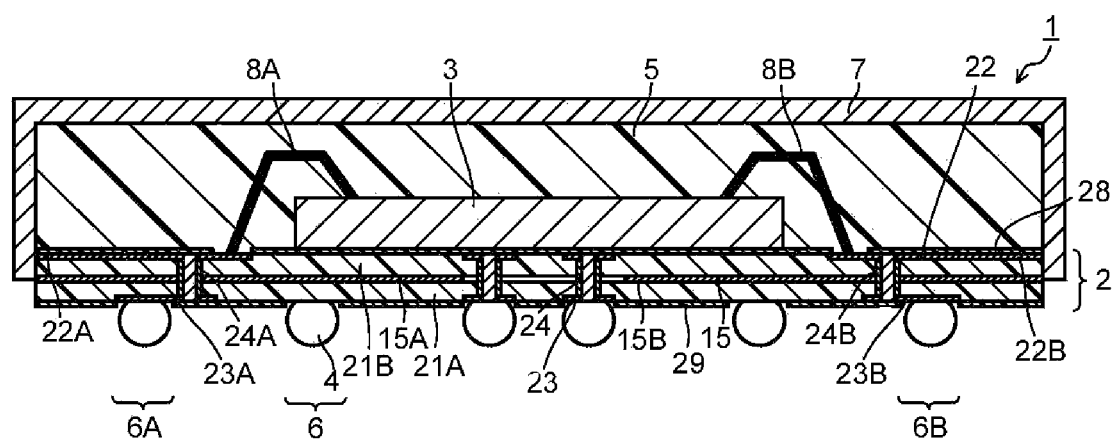
FIG. 5 is a cross-sectional view illustrating another example of the packaged semiconductor device.

A semiconductor device 1 illustrated in FIG. 5 includes an insulating layer 21A and an insulating layer 21B, instead of the single insulating layer 21 of the semiconductor device 1 illustrated in FIG. 2, and further includes a conductive layer 15 that is provided between the insulating layer 21A and the insulating layer 21B. Also, with respect to the configuration of the semiconductor chip 3, the sealing resin layer 5, the external connection terminals 6, the conductive shield layer 7, the bonding wire 8A, and the bonding wire 8B, the description of the semiconductor device 1 illustrated in FIG. 2 applies to this embodiment.

As the insulating layer 21A and the insulating layer 21B, for example, substrates used for the insulating layer 21 may be used.

The conductive layer 15 includes a conductive layer 15A and a conductive layer 15B. It is preferable that each of the conductive layer 15A and the conductive layer 15B should overlap with at least a portion of the location of the semiconductor chip 3 on wiring board 2. The conductive layer 15A has a function of acting as the first ground wire, and the conductive layer 15B has a function of acting as the second ground wire. It is preferable that each of the conductive layer 15A and the conductive layer 15B should be, for example, a solid film or a mesh film. In other words, it is preferable that at least one of the first ground wire and the second ground wire includes a solid film or a mesh film.

The conductive layer 15A and the conductive layer 15B are formed by forming a resist on a unitary conductive film by using, for example, a photolithographic technique, and removing some portions of the conductive film by using the resist as a mask to separate the unitary conductive film into the conductive layer 15A and the conductive layer 15B. It is preferable to use, for example, a material applicable for use as the conductive shield layer 7 as the conductive film material.

Also, the via 24A is formed through the insulating layer 21A, the conductive layer 15A, and the insulating layer 21B, and the via 24B is formed through the insulating layer 21A, the conductive layer 15B, and the insulating layer 21B. Also, vias 24A and B which are electrically connected to the signal wires and the like are electrically insulated from the conductive layer 15A and the conductive layer 15B. For example, by providing holes in the conductive layer 15B in advance, it is possible to electrically insulate the vias 24A and B which will be electrically connected to the signal wires and the like from the conductive layer 15A and the conductive layer 15B. Also, with respect to the configuration of the wire 22A, the wire 22B, the wire 23A, the wire 23B, the vias 24A, the vias 24B, the solder resist layer 28, and the solder resist layer 29, the description of the semiconductor device 1 illustrated in FIG. 2 is used in this embodiment.

By providing the conductive layer 15A and the conductive layer 15B, it is possible to improve the effect of suppressing leakage of electromagnetic energy through the wiring board 2. Further, it is preferable that the side surface of the conductive layer 15A and the side surface of the conductive layer 15B should come into contact with the conductive shield layer 7. In this case, since it is possible to increase the number of connection points by connecting a continuous or wire mesh film layer to the conductive shield layer 7, it is possible to suppress failures in the connections of the ground terminal 6A and the ground terminal 6B with the conductive shield layer 7, and since this also reduces contact resistance between the conductive shield layer 7 and the conductive layers 15A and B, it is possible to improve the magnetic shielding effect.

Figure 6:
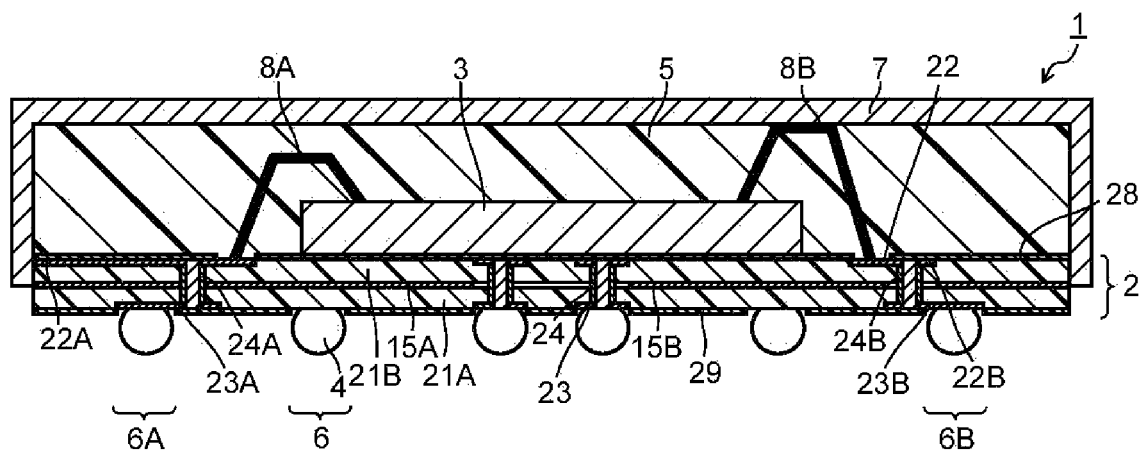
FIG. 6 is a cross-sectional view illustrating another example of the packaged semiconductor device.

A semiconductor device 1 illustrated in FIG. 6 is different from the semiconductor device 1 illustrated in FIG. 5 in that the surface of the bonding wire 8B is exposed at a surface of the sealing resin layer 5, and comes into contact with the conductive shield layer 7. In this case, a dummy electrode pad may be provided on the semiconductor chip 3 and the bonding wire 8B may be connected to the corresponding electrode pad. Also, the via 24B is electrically insulated from the conductive layer 15B, and the side surface of the wire 22B does not come into contact with the conductive shield layer 7. For example, by forming a hole in the conductive layer 15B in advance, it is possible to electrically insulate the via 24B and the conductive layer 15B from each other. In this case, the side surface of the wire 23B or the conductive layer 15B may not be in contact with the conductive shield layer 7. According to the above described structure, the ground terminal 6B becomes a terminal for conductivity inspection, and thus during conductivity inspection, there is a risk that the DC test voltage could negatively affect the integrated circuit.

Figure 7:
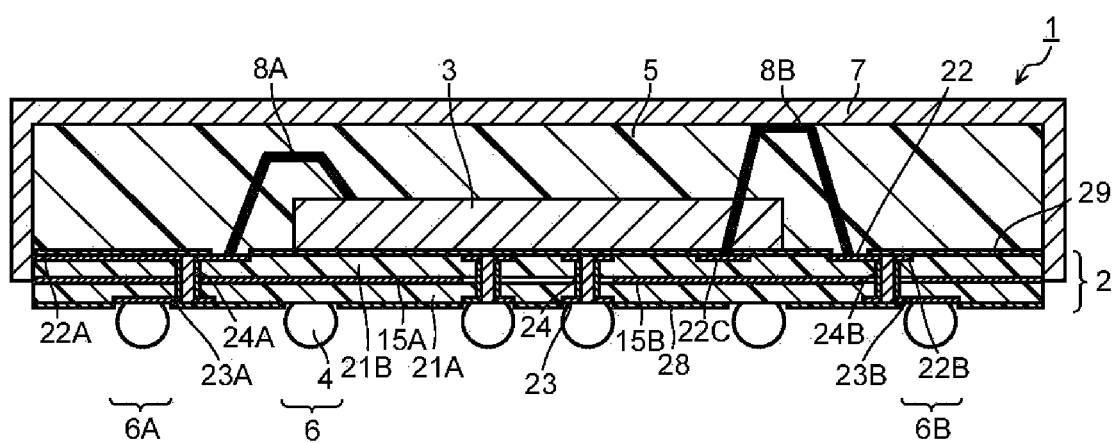
FIG. 7 is a cross-sectional view illustrating another example of the packaged semiconductor device.

A semiconductor device 1 illustrated in FIG. 7 is different from the semiconductor device 1 illustrated in FIG. 6 in that the bonding wire 8B is electrically connected to a connecting pad 22C provided on the wiring layer 22, not on the semiconductor chip 3. The connecting pad 22C thus functions as a dummy pad. According to the above described structure, the ground terminal 6B becomes a terminal for conductivity inspection, and thus during conductivity inspection, there is a risk that the DC test voltage could negatively affect the integrated circuit.

Figure 8:
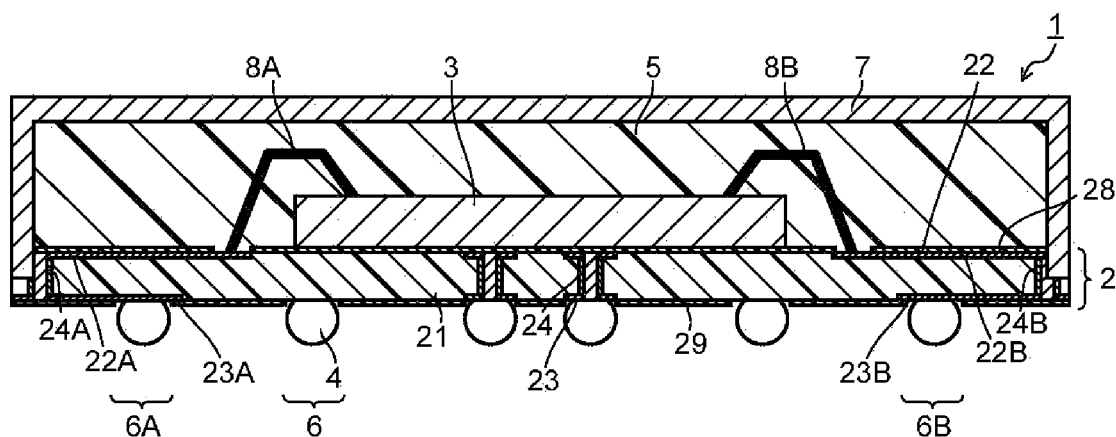
FIG. 8 is a cross-sectional view illustrating another example of the packaged semiconductor device.

A semiconductor device 1 illustrated in FIG. 8 has the same structure as that of the semiconductor device 1 illustrated in FIG. 2 except for the via 24A and the via 24B are disposed at, and at least partially open to, the edge of the wiring board 2 and a side surface of the via 24A is exposed at the side surface of the wiring board 2, and comes into contact with the conductive shield layer 7, and the exposed side surface of the via 24B is exposed at the side surface of the wiring board 2, and comes into contact with the conductive shield layer 7. Also, in the semiconductor device 1 illustrated in FIG. 8, the widths of the via 24A and the via 24B are as small as one-half that of the vias 24A and B of the previous embodiments hereof. However, the present disclosure is not limited thereto. The via 24A and the via 24B may have different alignments and shapes in the thickness direction (the direction in which the vias 24 are formed). Also, the exposed surface of each of the via 24A and the via 24B needs only to include a portion of the corresponding vias.

If the exposed surfaces of the via 24A and the via 24B are brought into contact with the conductive shield layer 7, since it is possible to increase the contact areas of the via 24A and the via 24B with the conductive shield layer 7, that is, the contact areas of the first ground wire and the second ground wire with the conductive shield layer 7, it is possible to reduce the contact resistance, and it is possible to improve the magnetic shielding effect. Also, instead of the insulating layer 21 of the semiconductor device 1 illustrated in FIG. 8, the insulating layer 21A and the insulating layer 21B of the semiconductor device 1 illustrated in FIG. 5 may be provided, and the conductive layer 15A and the conductive layer 15B may be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of inspecting a semiconductor device, the method comprising:
   measuring a resistance value between a first terminal and second terminal;
   determining a connection state of a first wire and a second wire to a conductive shield layer based on the resistance value, wherein the semiconductor device comprises:
   a wiring board having a first surface, a second surface, the first wire, and the second wire, the first terminal being on the second surface and the second terminal being on the second surface;
   a semiconductor chip on the first surface;
   a sealing resin layer on the first surface and sealing the semiconductor chip; and
   the conductive shield layer covering at least a portion of side surfaces of the wiring board and the sealing resin layer, wherein
   the first wire and the second wire are electrically insulated from each other on the wiring board,
   the conductive shield layer is electrically connected to the first wire and the second wire at different edges of the first surface of the wiring board,
   the first wire includes a first extending portion on the first surface of the wiring board,
   the second wire includes a second extending portion on the first surface of the wiring board,
   the first extending portion directly contacts the conductive shield at a first edge of the wiring board,
   the second extending portion directly contacts the conductive shield at a second edge of the wiring board, and
   the resistance value includes a first contact resistance between the first extending portion and the conductive shield layer and a second contact resistance between the second extending portion and the conductive shield layer.

2. The method according to claim 1, wherein
   the first terminal is an external connection terminal, and
   the second terminal is an inspection terminal.

3. The method according to claim 1, wherein the semiconductor chip is mounted above a portion of the first wire and a portion of the second wire.

4. The method according to claim 1, wherein
   the second edge is opposite from the first edge, and
   the conductive shield extends at least partially past the first surface of the wiring board toward the second surface of the wiring board.

5. The method according to claim 1, wherein
   the first and second extending portion each extend to past the edges of the first surface of the wiring board on a side surface of the wiring board, and
   the conductive shield extends at least partially over the side surface of the wiring board.

6. The method according to claim 1, wherein
   the ends of the first and second extending portions are exposed at an outer edge of the first surface of the wiring board, and
   the conductive shield connects to the first and second wires only at the outer edge of the first surface of the wiring board.

7. The method according to claim 1, wherein the wiring board includes a solid film overlapping the location of the semiconductor chip on the wiring board.

8. The method according to claim 1, wherein the wiring board includes a mesh film overlapping the location of the semiconductor chip on the wiring board.

9. A method of inspecting a semiconductor device, comprising:
   electrically connecting a first grounding wire that is between a first surface of a wiring board and a second surface of the wiring board to a first ground terminal on the second surface through a first via;
   electrically connecting a second grounding wire that is between the first surface and the second surface to a second ground terminal on the second surface through a second via;
   electrically connecting a conductive shield layer to the first grounding wire through the first via;
   electrically connecting the conductive shield layer to the second grounding wire through the second via;
   measuring a resistance value between the first ground terminal and the second ground terminal of the semiconductor device; and
   determining the connection state of the first grounding wire and the second grounding wire to the conductive shield layer based on the measured resistance value, wherein
   the first and second grounding wires are electrically isolated from one another on the wiring board and electrically connected to the conductive shield layer at different side surfaces of the wiring board,
   the first via electrically connects to the conductive shield layer through a first extending portion provided on the first surface at a first edge of the wiring board, and
   the second via electrically connects to the conductive shield layer through a second extending portion provided on the first surface at a second edge of the wiring board,
   the first extending portion directly contacts the conductive shield at the first edge of the wiring board,
   the second extending portion directly contacts the conductive shield at the second edge of the wiring board, and
   the resistance value includes a first contact resistance between the first extending portion and the conductive shield layer and a second contact resistance between the second extending portion and the conductive shield layer.

10. The method of claim 9, wherein
    the first and second edges of the wiring board are opposite outer edges of the wiring board, and
    the first and second extending portions extend on at least a portion of the outer edges of the wiring board.

11. The method of claim 9, wherein a semiconductor chip is mounted to the first surface of the wiring board.

12. The method of claim 11, wherein the semiconductor chip covers a portion of the first grounding wire and a portion of the second grounding wire.

13. The method according to claim 11, wherein the wiring board includes a solid film overlapping the location of the semiconductor chip on the wiring board.

14. The method according to claim 11, wherein the wiring board includes a mesh film overlapping the location of the semiconductor chip on the wiring board.

15. The method of according to claim 1, wherein measuring the resistance value does not include physically contacting the conductive shield layer with a tester.

16. The method according to claim 9, wherein
    the first extending portion divides into a plurality of separate portions on the first surface each of the separate portions of the first extending portion directly contacts the conductive shield layer at a different location spaced from each other location along the first edge, and the second extending portion divides into a plurality of separate portions on the first surface each of the separate portions of the second extending portion directly contacts the conductive shield layer at a different location spaced from each other location along the second edge.

17. The method of according to claim 9, wherein measuring the resistance does not include physically contacting the conductive shield layer with a tester.

* * * * *